United States Patent
Zhang et al.

(10) Patent No.: US 11,063,070 B2
(45) Date of Patent: Jul. 13, 2021

(54) SUBSTRATE AND FABRICATING METHOD THEREOF, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhen Zhang, Beijing (CN); Xudong An, Beijing (CN); Junjie Zhao, Beijing (CN); Guangzhou Zhao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/611,003

(22) PCT Filed: May 13, 2019

(86) PCT No.: PCT/CN2019/086667
§ 371 (c)(1),
(2) Date: Nov. 5, 2019

(87) PCT Pub. No.: WO2020/019829
PCT Pub. Date: Jan. 30, 2020

(65) Prior Publication Data
US 2020/0144313 A1    May 7, 2020

(30) Foreign Application Priority Data
Jul. 27, 2018  (CN) .......................... 201810851225.6

(51) Int. Cl.
*H01L 27/12* (2006.01)

(52) U.S. Cl.
CPC ........ *H01L 27/1288* (2013.01); *H01L 27/124* (2013.01); *H01L 27/127* (2013.01); *H01L 27/1262* (2013.01)

(58) Field of Classification Search
CPC ............... H01L 27/1288; H01L 27/124; H01L 27/1262; H01L 27/127
(Continued)

(56) References Cited

U.S. PATENT DOCUMENTS

2011/0180798 A1  7/2011  Shim et al.
2012/0182490 A1  7/2012  Kim et al.
(Continued)

FOREIGN PATENT DOCUMENTS

CN    102156369 A    8/2011
CN    105355630 A    2/2016
(Continued)

OTHER PUBLICATIONS

International Search Report dated Aug. 20, 2019, issued in counterpart application No. PCT/CN2019/086667. (10 pages).
(Continued)

*Primary Examiner* — Igwe U Anya
(74) *Attorney, Agent, or Firm* — Westerman, Hattori, Daniels & Adrian, LLP

(57) ABSTRACT

A method of fabricating a substrate is provided. The method of fabricating the substrate includes forming a first conductive pattern; forming a first insulating layer, and forming a first blind hole in the first insulating layer; forming a conductive film layer, and removing at least a portion of the conductive film layer in the first blind hole; thinning a portion of the first insulating layer at a bottom of the first blind hole to form a second blind hole; forming an intermediate insulating layer, and forming a second via hole in the intermediate insulating layer; removing the portion of
(Continued)

the first insulating layer and forming a first via hole in the first insulating pattern layer; and forming a second conductive pattern. The second conductive pattern directly contacts the first conductive pattern through the first via hole and the second via hole and insulates from the intermediate conductive pattern.

20 Claims, 9 Drawing Sheets

(58) Field of Classification Search
USPC .......................................................... 257/72
See application file for complete search history.

(56) References Cited

U.S. PATENT DOCUMENTS

| | | | | |
|---|---|---|---|---|
| 2016/0027808 | A1* | 1/2016 | Kim | H01L 27/1248 349/43 |
| 2016/0187695 | A1* | 6/2016 | Cho | H01L 29/78633 349/12 |
| 2017/0357134 | A1 | 12/2017 | Wang et al. | |
| 2018/0046045 | A1* | 2/2018 | Chen | G02F 1/136259 |
| 2019/0131316 | A1 | 5/2019 | Su et al. | |

FOREIGN PATENT DOCUMENTS

| | | |
|---|---|---|
| CN | 106158883 A | 11/2016 |
| CN | 107316839 A | 11/2017 |
| CN | 107808886 A | 3/2018 |
| CN | 109003944 A | 12/2018 |

OTHER PUBLICATIONS

Office Action dated Dec. 20, 2019, issued in counterpart CN application No. 201810851225.6, with English translation. (15 pages).

* cited by examiner

SUBSTRATE AND FABRICATING METHOD THEREOF, AND DISPLAY APPARATUS

CROSS-REFERENCE TO RELATED APPLICATIONS

This application claims benefit of the filing date of Chinese Patent Application No. 201810851225.6 filed on Jul. 27, 2018, the disclosure of which is hereby incorporated in its entirety by reference.

TECHNICAL FIELD

The disclosure relates to the field of display technology, in particular, to a substrate, a fabricating method thereof, and a display apparatus.

BACKGROUND

In the fabrication of electronic apparatuses, it is often necessary to connect conductive patterns located in different layers through an via hole. Especially in the case where another intermediate conductive pattern is disposed between the two conductive patterns, due to limitation of the manufacturing process, it is generally, necessary to reserve a large process margin between the intermediate conductive pattern and the portion of the via hole in the same layer. In this way, because the reserved process margin is large, the layout design is wasteful. For example, for a display apparatus, if a large margin is reserved in the effective display area (ie, the AA area), it is very unfavorable for design of a high PPI (Pixels Per Inch) display apparatus.

BRIEF SUMMARY

An embodiment of the present disclosure provides a method of fabricating a substrate. The method of fabricating the substrate may include forming a first conductive pattern on a base substrate; forming a first insulating layer on the base substrate on which the first conductive pattern was formed, and funning a first blind hole in the first insulating layer at a position corresponding to the first conductive pattern to form a first insulating pattern intermediate layer; forming a conductive film layer on the base substrate on which the first insulating pattern intermediate layer was formed, and removing at least a portion of the conductive film layer in the first blind hole to form an intermediate conductive pattern; further thinning a portion of the first insulating layer at a bottom of the first blind hole to form a second blind hole at the position corresponding to the first conductive pattern in the first insulating pattern intermediate layer to form a first insulating pattern layer; forming an intermediate insulating layer on the base substrate on which the first insulating pattern layer was formed, and forming a second via hole in the intermediate insulating layer at a position corresponding to the first conductive pattern and the second blind hole in the first insulating pattern layer to form an intermediate insulating pattern layer; removing the portion of the first insulating layer at the bottom of the second blind hole and forming a first via hole in the first insulating pattern layer to form a first insulating pattern; and forming a second conductive pattern on the base substrate on which the first insulating pattern was formed. The second conductive pattern directly contacts the first conductive pattern through the first via hole and the second via hole and insulates from the intermediate conductive pattern.

Optionally, forming the first blind hole in the first insulating layer at the position corresponding to the first conductive pattern is performed by a halftone process.

Optionally, removing at least the portion of the conductive film layer in the first blind hole to form the intermediate conductive pattern and further thinning the portion of the first insulating layer at the bottom of the first blind hole to form the second blind hole is performed by an etching process.

Optionally, the etching process is a dry etching process.

Optionally, removing the portion of the first insulating layer at the bottom of the second blind hole and forming the first via hole in the first insulating pattern layer is performed by an aching process.

Optionally, a diameter of the second via hole is larger than a diameter of the first via hole.

Optionally, a boundary of the first blind hole is aligned with a boundary of the first conductive pattern.

Optionally, a distance between orthographic projection of the intermediate conductive pattern on the base substrate and orthographic projection of the adjacent first conductive pattern is within a critical dimension range.

Optionally, the critical dimension range is about 0.8 µm.

Optionally, a thickness of the portion of the first insulating layer at the bottom of the first blind hole before forming the conductive film layer is about 250 nm to about 350 nm.

Optionally, a thickness of the portion of the first insulating layer at the bottom of the second blind hole before forming the intermediate insulating layer is about 20 nm to about 50 nm.

Optionally, forming the second via hole at the position corresponding to the preset position in the intermediate insulating layer is performed by an exposure mask process.

Optionally, the first insulating layer and/or the intermediate insulating layer are both made of organic insulating material.

Optionally, before removing the portion of the first insulating layer at the bottom of the second blind hole to form the first via hole, the method of fabricating the substrate further comprises forming a second conductive film layer on the base substrate on which the intermediate insulating pattern layer was formed, and removing at least a portion of the second conductive film layer in the second blind hole and further thinning the portion of the first insulating layer at the bottom of the second blind hole to form a second intermediate conductive pattern; and forming an second intermediate insulating layer on the base substrate on which the second intermediate conductive pattern was formed, and forming a third via hole at a position corresponding to the preset position in the second intermediate insulating layer to form an second intermediate insulating pattern layer.

Optionally, a diameter of the third via hole is larger than a diameter of the second via hole.

One embodiment of the present disclosure is a display substrate obtained by the fabricating method according to one embodiment of the present disclosure.

Optionally, the display substrate is an array substrate or an OLED array substrate, the first conductive pattern is a first source and drain layer, and the intermediate conductive pattern is a second source and drain layer.

One embodiment of the present disclosure is a substrate comprising: a first conductive pattern, a first insulating pattern layer, an intermediate conductive pattern, an intermediate insulating pattern layer, and a second conductive pattern sequentially disposed on a base substrate. The second conductive pattern is directly connected to the first conductive pattern through a via hole located in the first insulating pattern layer, the intermediate conductive pattern, and the intermediate insulating pattern layer, and is not connected to the intermediate conductive pattern. A distance between a boundary of the intermediate conductive pattern facing the via hole and a boundary of the first conductive pattern opposite to each other is within a critical line deviation.

Optionally, the critical dimension range is about 0.8 μm.

One example of the present disclosure is a display apparatus, comprising the substrate according to one embodiment of the present disclosure.

BRIEF DESCRIPTION OF THE DRAWINGS

The drawings are used to provide a further understanding of the technical solutions of the present disclosure, and constitute a part of the specification, which together with the embodiments of the present application are used to explain the technical solutions of the present disclosure, and do not constitute a limitation of the technical solutions of the present disclosure. The shapes and sizes of the various components in the drawings do not reflect true proportions, and are merely intended to illustrate the present disclosure.

DETAILED DESCRIPTION

Figure 1:
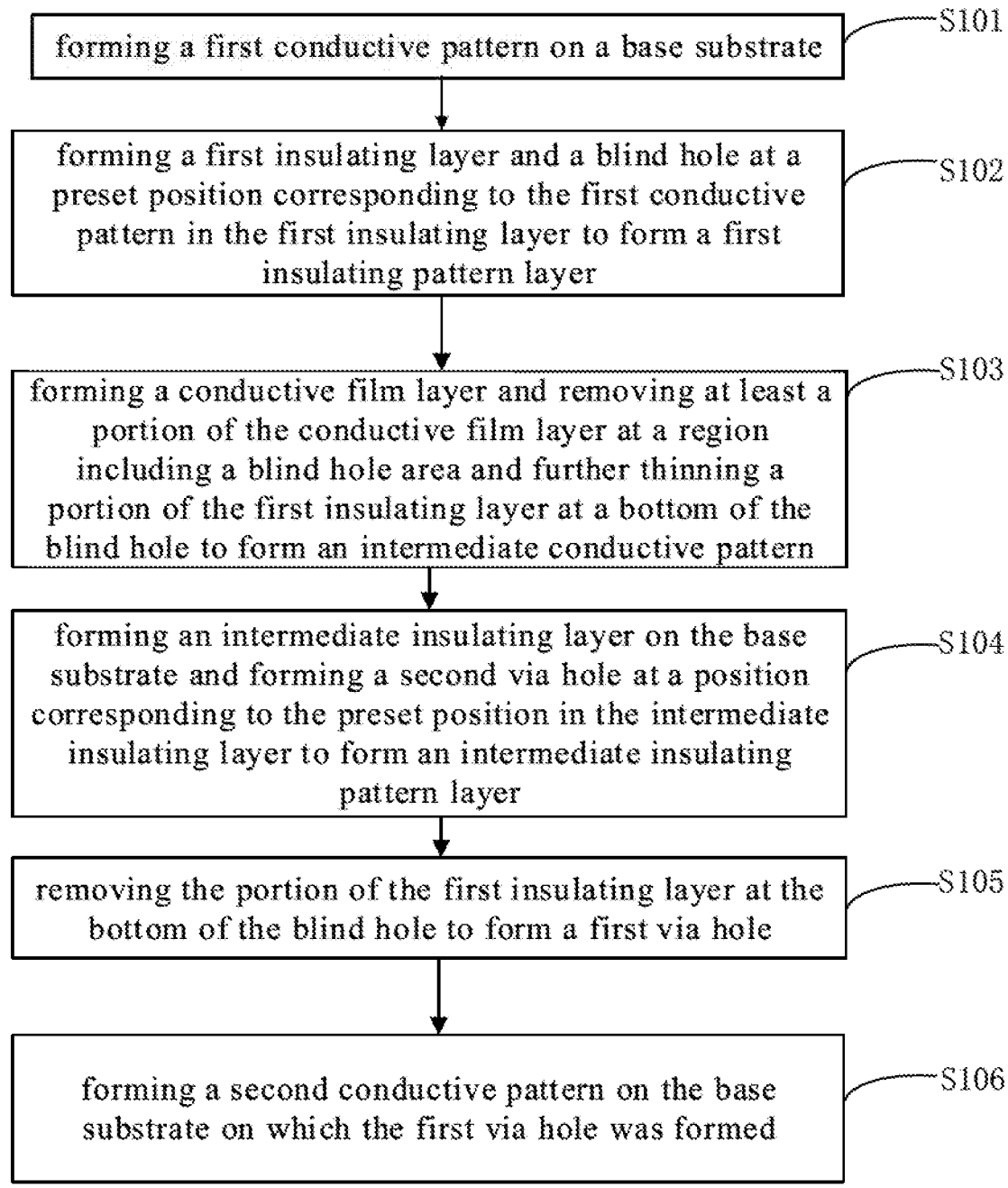
FIG. 1 is a schematic flow chart of a method for fabricating a substrate according to one embodiment of the present disclosure.

The specific embodiments of the present disclosure are further described in detail below with reference to the drawings and embodiments. The following examples are intended to illustrate the disclosure but are not intended to limit the scope of the disclosure. It should be noted that, in the case of no conflict, the features in the embodiments and the embodiments in the present application could be arbitrarily combined with each other. Throughout the description of the disclosure, reference is made to FIGS. 1-10. When referring to the figures, like structures and elements shown throughout are indicated with like reference numerals. It should be understood that the dimensions of the various parts shown in the drawings are not drawn in the actual scale.

In the description of the specification, references made to the term "one embodiment," "some embodiments," and "exemplary embodiments," "example," and "specific example," or "some examples" and the like are intended to refer that specific features and structures, materials or characteristics described in connection with the embodiment or example that are included in at least some embodiments or example of the present disclosure. The schematic expression of the tends does not necessarily refer to the same embodiment or example. Moreover, the specific features, structures, materials or characteristics described may be included in any suitable manner in any one or more embodiments or examples.

For the purpose of surface description hereinafter, as direction-calibrated in the accompanying drawings, the terms "above", "below", "left", "right", "vertical", "horizontal", "top", "bottom" and derivatives thereof shall relate to the present disclosure. The terms "covers", "on", "positioned on", or "positioned on top of" mean that, for example, a first element of a first structure is on a second element of a second structure, wherein an intermediate element such as an intermediate structure may exist between the first element and the second element. The term "contact" means that, for example, the first element of the first structure and the second element of the second structure are connected directly or indirectly, and other elements may exist or not exist at the interface between the two elements.

In addition, the terms "first" and "second" are for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

Unless otherwise defined, all the terms (including the technical and scientific terms) used herein have the same meanings as commonly understood by one of ordinary skill in the art to which the present disclosure is directed. It is also understood that the terms such as defined in the usual dictionary should be interpreted as having the same meanings as the meaning in the context of the relevant technology. The terms should not be interpreted as an idealization or as having extreme meanings, unless they are explicitly defined herein. As employed herein, the statement that two or more parts are "connected" or "coupled" together shall mean that the parts are joined together either directly or joined through one or more intermediate parts.

A numerical range modified by "about" herein means that the upper and lower limits of the numerical range can vary by 10% thereof.

Figure 2:
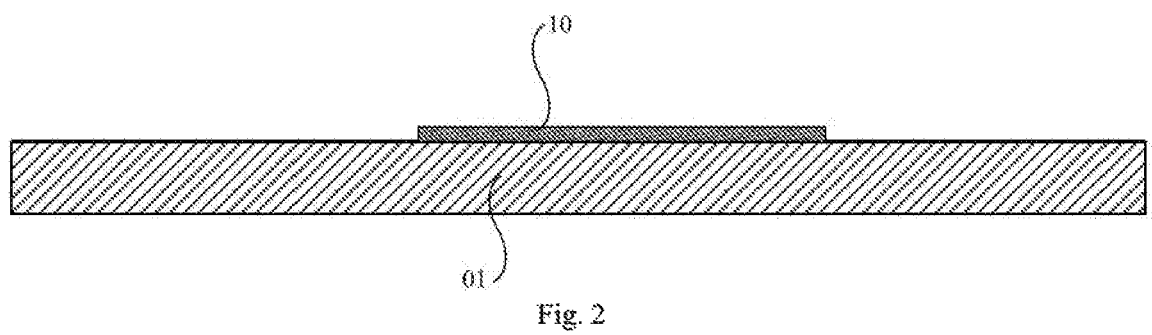
FIG. 2 is a schematic structural diagram of a substrate during a manufacturing process according to one embodiment of the present disclosure.
Figure 3:
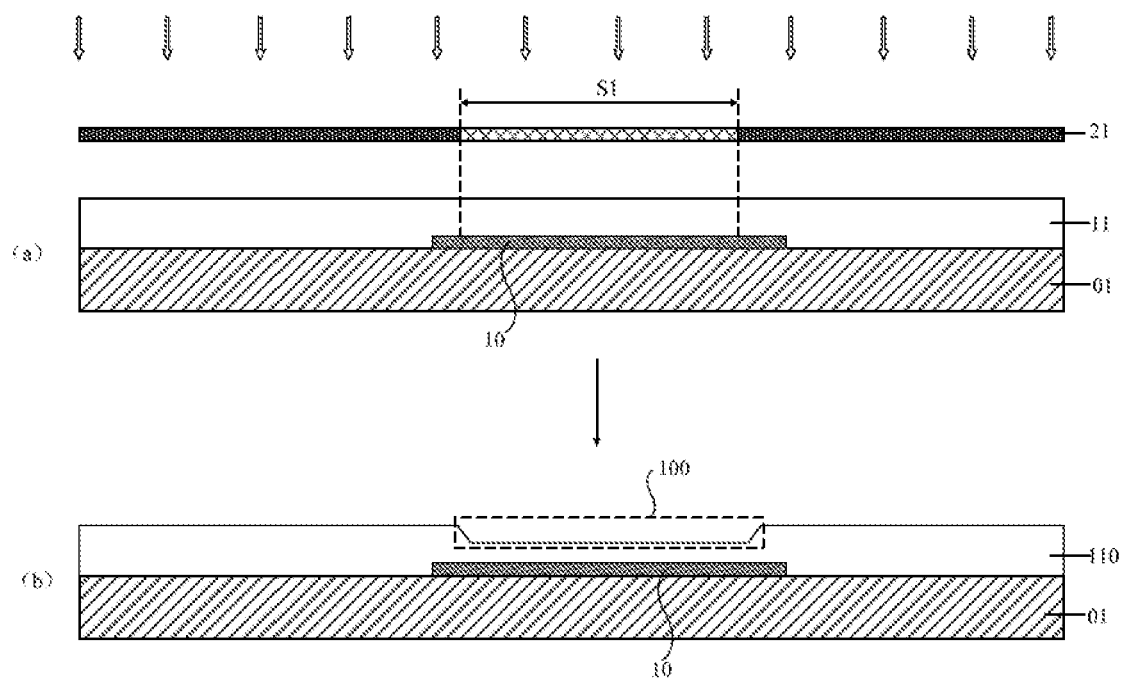
FIG. 3 is a schematic structural diagram of a substrate during a manufacturing process according to one embodiment of the present disclosure.

One embodiment of the present disclosure provides a method for manufacturing a substrate. As shown in FIG. 1, the manufacturing method includes steps S101 to S106:

As shown in FIG. 2, step S101 includes forming a first conductive pattern 10 on a base substrate 01. Specifically, the first conductive pattern 10 is formed on the base substrate 01 by a patterning process using a conductive material.

In the present disclosure, the patterning process may include a photolithography process, or may include a photolithography process, an etching step, and other processes for forming a predetermined pattern such as inkjet printing etc. The photolithography process refers to a process of forming a pattern by processes of film formation, exposure, and development using a photoresist, a mask, an exposure machine, and the like. A corresponding patterning process can be selected based on the structure formed in the present disclosure.

As shown in FIG. 3(a), step S102 includes forming a first insulating layer 11 on the base substrate 01 on which the first conductive pattern 10 was formed and, as shown in FIG. 3(b), forming a first blind hole 100 in the first insulating layer 11 at a preset position S1 corresponding to the first conductive pattern 10 by a half exposure mask process (also referred to as a semi-transparent mask process or a half hole mask process/Half Tone) to form a first insulating pattern intermediate layer 110.

In one embodiment, as shown in FIG. 3(a), a semi-transparent mask 21 is used in the above-mentioned half exposure mask process. Those skilled in the art should understand that the first insulating layer 11 is formed into a semi-retained portion (corresponding to the preset position S1) and a full reserved portion (corresponding to the area other than the preset position S1). Of course, the semi-transparent mask 21 can be designed to form a completely removed portion of the first insulating layer 11 as needed.

In one embodiment, a first insulating layer 11 having a thickness of about 1.5 μm may be formed on the base substrate 01 on which the first conductive pattern 10 was formed. Furthermore, at the preset position S1 corresponding to the first conductive pattern 10, a first blind hole 100 having a bottom thickness of 250 nm to 350 nm may be formed by a half exposure mask process.

In the embodiment, the first blind hole 100 has a retained portion at the bottom. That is, the first insulating layer 11 still has a retained portion at the first blind hole position so that the first conductive pattern 10 located underneath the first blind hole 100 can be protected to a certain extent, thereby avoiding damage to the first conductive pattern 10 by subsequent processes (such as subsequent etching processes). In one embodiment, a thickness of the retained portion at the bottom of the first blind hole is about 250 nm.

In one embodiment, the first insulating layer 11 is generally formed of an organic insulating material. After completion of the half exposure mask process, curing is generally required. For example, thermal curing may be employed.

As shown in FIG. 4(a), step S103 includes forming a conductive film layer 12 on the base substrate 01 on which the first insulating pattern intermediate layer 110 was formed, and removing at least a portion of the conductive film layer 12 at a region including the first blind hole A1 by an etching process. As shown in FIG. 4(b), while an intermediate conductive pattern 120 is formed, the thickness of the first insulating layer 11 in the first blind hole is further thinned to form a second blind hole. In one embodiment, the thickness is reduced from D1 in the first blind hole before etching to D2 in the second blind hole, refer to FIG. 4(a) to (b), for example, from 250 nm to 30 nm.

It should be understood here that, first, the above process of forming the intermediate conductive pattern 120 generally includes: exposure, development, etching, stripping, etc. For the "etching process" used in this step, in view that the conductive film layer 12 is generally made of a metal conductive material and specific etching degree requirement, in the above step S103, a dry etching method may be adopted to remove at least the portion of the conductive film layer 12 at a region including the first blind hole area A1. Furthermore, while the intermediate conductive pattern 120 is formed, the thickness of the first insulating layer 11 in the first blind hole area A1 is further thinned.

Second, in the present disclosure, the "first blind hole area A1" covers at least the first blind hole, and the outer boundary of the first blind hole area A1 is generally beyond the edge of the first blind hole. For example, in practice, the first blind hole area A1 can be aligned with the boundary of the first conductive pattern.

Third, the above dry etching generally uses a gas plasma generated by a vacuum gas and an RP Power (plasma gas source) to generate atoms and radicals, and the atoms and radicals react with materials deposited on the base substrate to form volatile species.

Fourth, the above-mentioned "forming the intermediate conductive pattern 120 while further thinning the thickness of the first insulating layer 11 in the first blind hole area A1" means that when the conductive film layer 12 is formed into the intermediate conductive pattern 120 by an etching process, inevitably, the thickness of the first insulating layer 11 in the first blind hole area A1 is etched, so that the thickness of the first insulating layer 11 in the first blind hole is thinned. That is to say, if a via hole is formed in the step S102 instead of a blind bole, when the etching process is performed in the step S103, the first conductive pattern 10 is inevitably etched, thereby causing damage.

Figure 5:
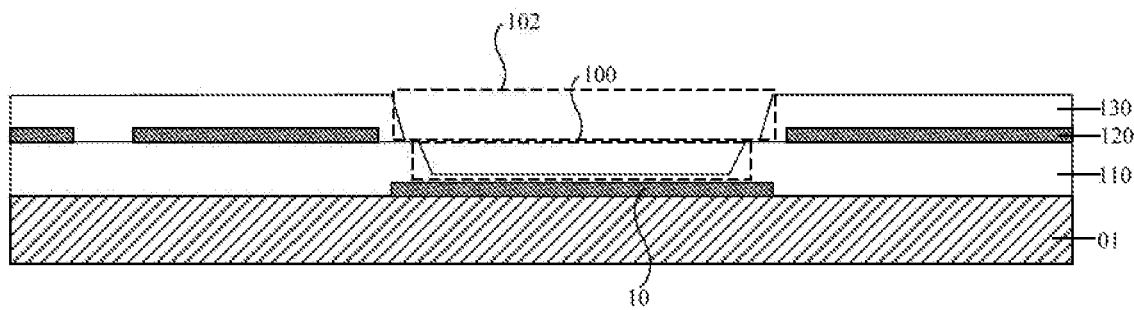
FIG. 5 is a schematic structural diagram of a substrate during a manufacturing process according to one embodiment of the present disclosure.

As shown in FIG. 5, step S104 includes forming an intermediate insulating layer on the base substrate 01 on which the intermediate conductive pattern 120 was formed, and forming, by the exposure mask process, a second via hole 102 in the intermediate insulating layer at a position corresponding to the preset position S1 (that is, corresponding to the second blind hole position), thereby forming an intermediate insulating pattern layer 130.

The above intermediate insulating layer may be made of an organic insulating material, and after the exposure mask process is completed, curing is generally required. For example, thermal curing may be employed.

Figure 6:
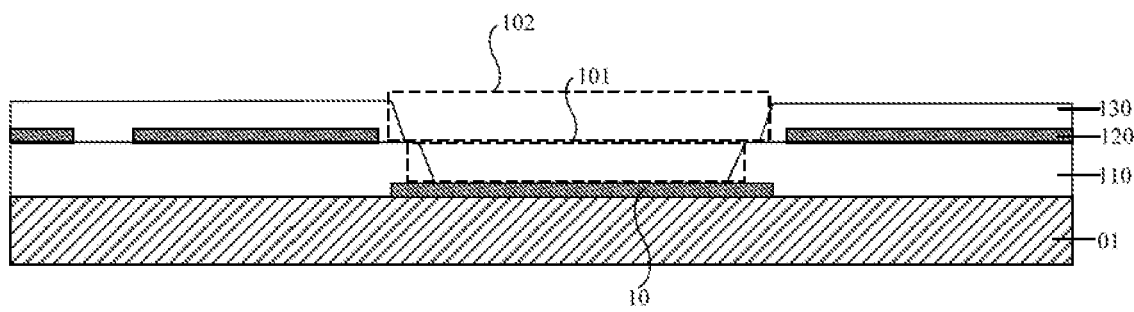
FIG. 6 is a schematic structural diagram of a substrate during a manufacturing process according to one embodiment of the present disclosure.

As shown in FIG. 6, step S105 includes forming a first via hole 101 by removing the portion of the first insulating layer 11 located at the bottom of the second blind hole in the base substrate 01 on which the intermediate insulating pattern layer 130 was formed.

Preferably, an asking process (or Descum) is generally used to remove the portion of the first insulating layer 11 at the bottom of the second blind hole 200 in the base substrate 01 formed with the intermediate insulating pattern layer 130 to form the first via hole 101.

As shown in FIG. 7, step S106 includes forming a second conductive pattern 20 on the base substrate 01 on which the first via hole 101 was formed. Furthermore, the second conductive pattern 20 is directly in contact with the first conductive pattern 10 through the first via hole 101 and the second via hole 102 and is not in contact with the intermediate conductive pattern 130.

In summary, in the prior art, a process margin of a certain width between a portion of the intermediate conductive layer at the location of the via hole and other conductive patterns in the same layer is reserved. For processing reasons, the size of the process margin is at least 2.5 μm, which leads to problem of wasted layout. In contrast, in some embodiments of the present disclosure, when the intermediate conductive pattern is formed in step S103, the portion of the intermediate conductive film layer corresponding to the blind hole area is directly removed, thereby eliminating the need of the reservation of process margins on both sides. As a result, the problem of wasted layout due to the large reserved margin in the prior art can be avoided.

Figure 4:
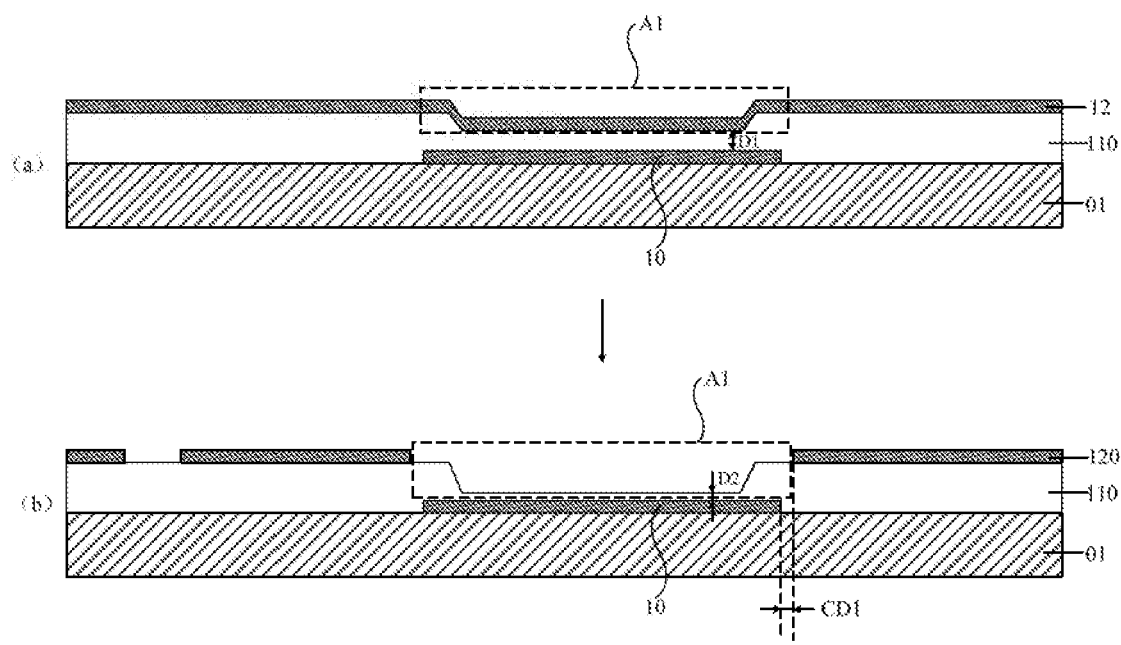
FIG. 4 is a schematic structural diagram of a substrate during a manufacturing process according to one embodiment of the present disclosure.
Figure 8:
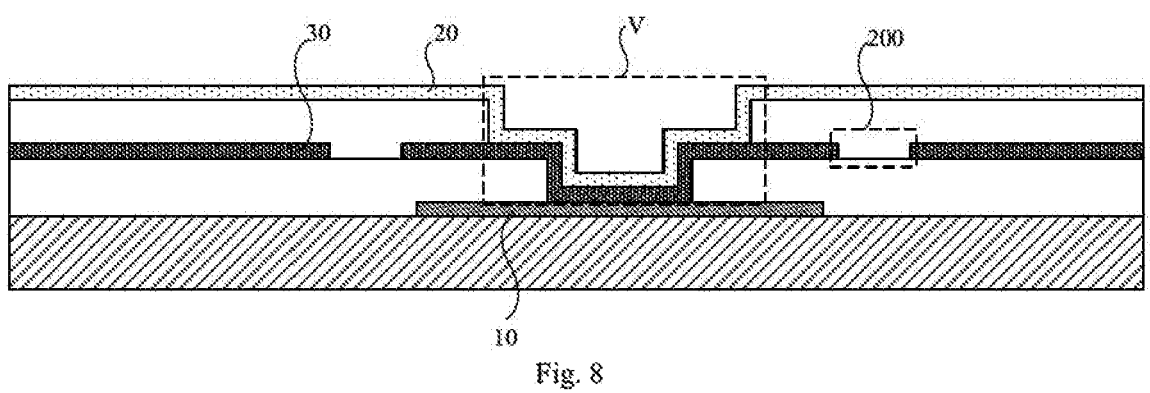
FIG. 8 is a schematic structural diagram of a substrate in the related art.

Specifically, as shown in FIG. 4 and FIG. 8 (a schematic diagram of a related base substrate for the present disclosure), the following further explains the actual setting for reducing the process margin in the present disclosure.

As shown in FIG. 4(b), in the present disclosure, at least the portion of the conductive film layer 12 including the corresponding blind hole area is removed. The outer boundary of the blind hole area A1 is generally aligned with the boundary of the first conductive pattern 10 on a same side. In the existing alignment process, there is generally a critical line deviation of 0.8 µm (ie, CD1=0.8 µm). That is to say, with the fabrication scheme of the present disclosure, the process margin from the boundary of the first conductive pattern 10 is at most 0.8 µm.

In contrast, as shown in FIG. 8, there is an intermediate conductive layer between the first conductive pattern 10 and the second conductive pattern 20. An insulating layer is disposed between adjacent conductive pattern layers. The first conductive pattern 10 and the second conductive pattern 20 need to be connected through the via hole V. In actual fabrication, the portion of the intermediate conductive layer at the via hole V area is generally retained. In order to prevent the portion of the intermediate conductive layer located at the via hole V area from being short-circuited with other conductive patterns of the same layer, generally, it is necessary to reserve a process margin of a certain width between the portion of the intermediate conductive layer at the via hole V area and the conductive patterns of the same layer. Limited by the existing fabrication process, the process margin is generally at least 2.5 µm spacing in order to ensure that the two patterns in the same layer are completely separated, so that the conductive patterns of the same layer can transmit signals normally. Of course, the process margin of the design is also designed with reference to the boundary of the first conductive pattern 10. In addition, in the design method, the critical line deviation may or may not be considered.

It can be seen from the above comparison that the margin reserved by the fabricating process of the present disclosure is reduced by at least 1.7 µm compared with the margin reserved in the prior art, and the reduction at both sides is 3.4 µm. Thus, for the display apparatus, the display design is more favorable for high PPI.

On the basis of this, referring to FIG. 6, in one embodiment of the present disclosure, the diameter of the second via hole 102 is larger than the diameter of the first via hole 101 to reduce the slope angle of the entire side surface formed by the first via hole 101 and the second via hole 102, thereby ensuring that the second conductive pattern 20 formed subsequently (step S106) does not break on the slope surface.

In one embodiment of the present disclosure, in the base substrate on which the intermediate insulating pattern layer 130 was formed, the portion of the first insulating layer 11 located at the bottom of the second blind hole 200 is removed in the step S105 to form the first via hole 101. The thickness of the portion of the first insulating layer 11 located at the bottom of the second blind hole 200 (or the thickness of the first insulating layer 11 at the blind hole area A1 after it was further thinned by the etching process in step S103) before the removing is about 20 nm to about 50 nm.

Specifically, if the thickness of the portion of the first insulating layer 11 located at the bottom of the second blind hole 200 is less than 20 nm, the etching precision in the step S103 is required to be high, and the first conductive pattern is easily damaged by over etching. If the thickness of the portion of the first insulating layer 11 located at the bottom of the second blind hole 200 is greater than 50 nm, the processing depth in step S105 is required to be large (for example, an ashing process for a larger depth is required). When a portion of the first insulating layer 11 located in the blind hole area A1 is removed in step S105, the surface of the intermediate insulating pattern layer 130 is removed. If the processing depth is too large, in practice, the thickness of the intermediate insulating layer needs to be increased correspondingly, thereby causing unnecessary waste. Of course, in the present disclosure, the thickness of the portion of the first insulating layer 11 located at the bottom of the second blind hole 200 is controlled to be in an appropriate range before the ashing process. As such, the surface of the intermediate insulating pattern layer 130 can be appropriately treated (for example, cleaning, roughening, etc.), when the portion of the first insulating layer 11 located at the bottom of the second blind hole 200 is removed by ashing, thereby facilitating the tight bonding between the intermediate insulating pattern layer and the subsequent pattern layer.

On the basis of this, it should be noted that the above embodiments are all described by taking one intermediate conductive pattern 120 between the first conductive pattern 10 and the second conductive pattern 20 as an example, but the disclosure is not limited thereto. In practice, a plurality of intermediate conductive patterns 120 may also be disposed between the first conductive pattern 10 and the second conductive pattern 20.

Figure 9:
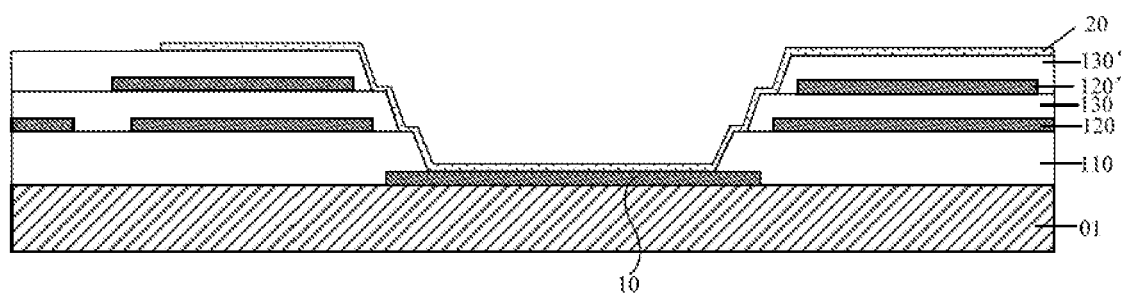
FIG. 9 is a schematic structural diagram of a substrate according to one embodiment of the present disclosure.

In one embodiment, as shown in FIG. 9, two intermediate conductive patterns (120 and 120') and two intermediate insulating pattern layers (130 and 130') may be disposed between the first conductive pattern 10 and the second conductive pattern 20. The manufacturing method in the present disclosure will be further explained below.

Specifically, after the intermediate insulating pattern layer 130 is formed in the foregoing step S104, the process of step S103 is performed again to form the second intermediate conductive pattern 120'. The thickness of the first insulating layer 11 in the blind hole area A1 is further reduced. Hence, in this case, it is required to appropriately increase the thickness of the first insulating layer 11 at the bottom of the blind hole 100 in step S102.

Then, step S104 is further performed to form a second intermediate insulating layer on the base substrate 01 on which the intermediate conductive pattern (the second intermediate conductive pattern 120) was formed, and form a via hole in the second intermediate insulating layer corresponding to the preset position S1 (also corresponding to the blind hole area) by an exposure mask process, thereby forming a second intermediate insulating pattern layer 130'.

Of course, in practice, it is generally required to ensure that the diameter of the via hole formed in the second intermediate insulating layer corresponding to the preset position S1 (which can also be said to be corresponding to the blind hole area) is larger than the diameter of the second via hole to ensure that the second conductive pattern 20 does not break on the surface of the via holes.

One embodiment of the present disclosure further provides a base substrate which is obtained by the above-mentioned fabricating method and has the same structure and advantageous effects as the base substrate provided by the foregoing embodiments. Since the foregoing embodiment has been described in detail for the structure and advantageous effects of the base substrate, the details are not described herein again.

Figure 7A:
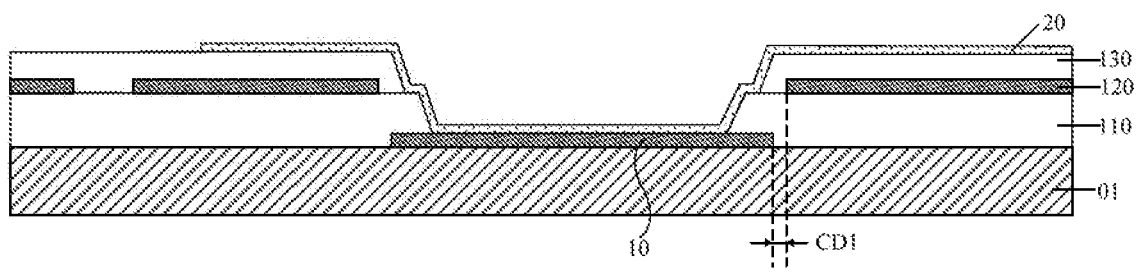
FIG. 7A is a schematic structural diagram of a substrate during a manufacturing process according to one embodiment of the present disclosure.

One embodiment of the present disclosure further provides a base substrate. As shown in FIG. 7A, the base substrate includes: a first conductive pattern 10, a first insulating pattern layer 110, an intermediate conductive pattern 120, an intermediate insulating pattern layer 130, and a second conductive pattern 20, which are sequentially disposed on the base substrate 01.

The second conductive pattern 20 is directly connected to the first conductive pattern 10 through the via holes in the first insulating pattern layer 110, the intermediate conductive pattern 120, and the intermediate insulating pattern layer 130, and is not connected to the intermediate conductive pattern 120. A distance between a boundary of the intermediate conductive pattern 120 facing the via hole and the boundary of the first conductive pattern 10 on the same side is within a critical dimension range (CD1). Herein the distance between a boundary of the intermediate conductive pattern 120 facing the via hole and the boundary of the first conductive pattern 10 on the same side refers to a distance between orthographic projection of the boundary of the intermediate conductive pattern 120 facing the via hole on the base substrate and orthographic projection of the boundary of the first conductive pattern 10 on the base substrate on the same side.

Figure 7B:
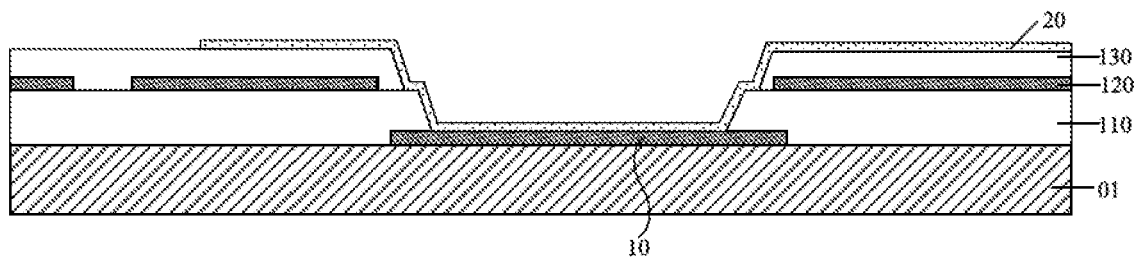
FIG. 7B is a schematic structural diagram of a substrate during a manufacturing process according to one embodiment of the present disclosure.

In one embodiment, orthographic projection of the boundary of the intermediate conductive pattern 120 on the base substrate overlaps orthographic projection of the boundary of the first conductive pattern on the base substrate, as shown in FIG. 7B.

In summary, the distance between a boundary of the intermediate conductive pattern 120 facing the via hole and the boundary of the first conductive pattern 10 on this side is within a critical dimension range (CD1). In general, the critical line dimension range CD1 is generally about 0.8 µm. That is, the process margin of the intermediate conductive pattern 120 at the via hole position is about 0.8 µm. Compared with the design scheme in FIG. 8 (a margin with at least 2.5 µm on one side), at least 1.7 µm is reduced and 3.4 µm is reduced at both sides, which is more favorable for high PPI display design. Specific reference may be made to the corresponding part of the foregoing substrate preparation method, which is not described herein.

In one embodiment, in the base substrate, as described in the foregoing embodiments, at the via hole area, the via hole (ie, the second via hole 102) of the intermediate insulating pattern layer 130 may have a larger diameter than the via hole (ie, first via hole 101) of the intermediate conductive pattern 120.

It should be noted that, in the embodiments of the present disclosure, the substrate may be at least applied to the array substrate. The array substrate may be an array substrate in a liquid crystal display panel (LCD) or an array substrate in an organic light emitting diode (OLED) panel.

In one embodiment, the array substrate is an array substrate (ie, an OLED array substrate) in an OLED panel. The first conductive pattern 10 in the array substrate is a data line. The second conductive pattern 20 is an anode of the OLED (which may generally be a transparent conductive material). The intermediate conductive pattern 120 is another relevant signal line in the array substrate.

One embodiment of the present disclosure further provides a display apparatus comprising the foregoing base substrate, which is also manufactured by the foregoing manufacturing method, and has the same structure and advantageous effects as the base substrate provided by the foregoing embodiment. Since the foregoing embodiment has described the structure and beneficial effects of the base substrate in detail, no further description is provided herein.

Figure 10:
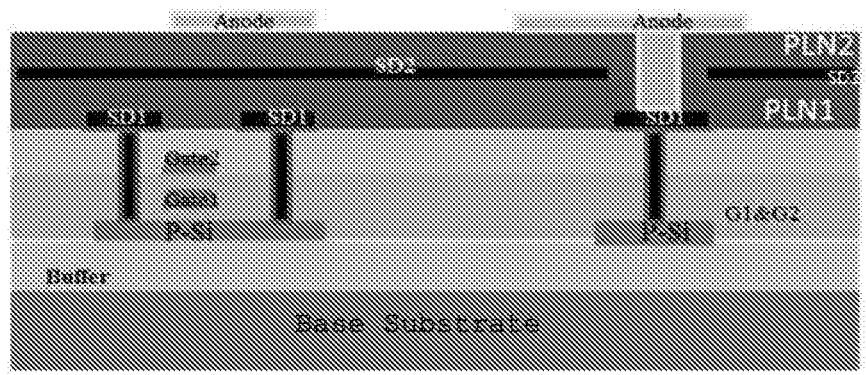
FIG. 10 is a schematic structural diagram of an OLED driver circuit according to one embodiment of the present disclosure.

FIG. 10 shows a schematic structural diagram of an OLED driver circuit according to one embodiment of the present disclosure. The driver circuit includes the display substrate according to one embodiment of the present disclosure as the OLED array substrate. The OLED array substrate includes a first conductive pattern and an intermediate conductive pattern. The first conductive pattern is a first source and drain (SD1) layer, and the intermediate conductive pattern is a second source and drain (SD2) layer. SD1 is insulated from SD2. The OLED array substrate further includes a first planarization layer (PLN1) on the SD1 layer and a second planarization layer (PLN2) on the SD2 layer. An anode is electrically coupled to the SD 1 through an via hole in the PLN1 and PLN2.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed is:

1. A method of fabricating a substrate, comprising:
   forming a first conductive pattern on a base substrate;
   forming a first insulating layer on the base substrate on which the first conductive pattern was formed, and forming a first blind hole in the first insulating layer at a position corresponding to the first conductive pattern to form a first insulating pattern intermediate layer;
   forming a conductive film layer on the base substrate on which the first insulating pattern intermediate layer was formed, and removing at least a portion of the conductive film layer in the first blind hole to form an intermediate conductive pattern;
   further thinning a portion of the first insulating layer at a bottom of the first blind hole to form a second blind hole at the position corresponding to the first conductive pattern in the first insulating pattern intermediate layer to form a first insulating pattern layer;
   forming an intermediate insulating layer on the base substrate on which the first insulating pattern layer was formed, and forming a second via hole in the intermediate insulating layer at a position corresponding to the first conductive pattern and the second blind hole in the first insulating pattern layer to form an intermediate insulating pattern layer;
   removing the portion of the first insulating layer at the bottom of the second blind hole and forming a first via hole in the first insulating pattern layer to form a first insulating pattern; and
   forming a second conductive pattern on the base substrate on which the first insulating pattern was formed,
   wherein the second conductive pattern directly contacts the first conductive pattern through the first via hole and the second via hole and insulates from the intermediate conductive pattern.

2. The method of fabricating the substrate of claim 1, wherein forming the first blind hole in the first insulating layer at the position corresponding to the first conductive pattern is performed by a halftone process.

3. The method of fabricating the substrate of claim 1, wherein removing at least the portion of the conductive film layer in the first blind hole to form the intermediate conductive pattern and further thinning the portion of the first insulating layer at the bottom of the first blind hole to form the second blind hole is performed by an etching process.

4. The method of fabricating the substrate of claim 3, wherein the etching process is a dry etching process.

5. The method of fabricating the substrate of claim 1, wherein removing the portion of the first insulating layer at the bottom of the second blind hole and forming the first via hole in the first insulating pattern layer is performed by an ashing process.

6. The method of fabricating the substrate of claim 1, wherein a diameter of the second via hole is larger than a diameter of the first via hole.

7. The method of fabricating the substrate of claim 1, wherein a boundary of the first blind hole is aligned with a boundary of the first conductive pattern.

8. The method of fabricating the substrate of claim 1, wherein a distance between orthographic projection of the intermediate conductive pattern on the base substrate and orthographic projection of the adjacent first conductive pattern is within a critical dimension range.

9. The method of fabricating the substrate of claim 8, wherein the critical dimension range is about 0.8 µm.

10. The method of fabricating the substrate of claim 1, wherein a thickness of the portion of the first insulating layer at the bottom of the first blind hole before forming the conductive film layer is about 250 nm to about 350 nm.

11. The method of fabricating the substrate of claim 1, wherein a thickness of the portion of the first insulating layer at the bottom of the second blind hole before forming the intermediate insulating layer is about 20 nm to about 50 nm.

12. The method of fabricating the substrate of claim 1, wherein forming the second via hole at the position corresponding to the preset position in the intermediate insulating layer is performed by an exposure mask process.

13. The method of fabricating the substrate according to claim 1, wherein the first insulating layer and/or the intermediate insulating layer are both made of organic insulating material.

14. The method of fabricating the substrate according to claim 1, before removing the portion of the first insulating layer at the bottom of the second blind hole to form the first via hole, further comprising:
   forming a second conductive film layer on the base substrate on which the intermediate insulating pattern layer was formed, and removing at least a portion of the second conductive film layer in the second blind hole and further thinning the portion of the first insulating layer at the bottom of the second blind hole to form a second intermediate conductive pattern; and
   forming an second intermediate insulating layer on the base substrate on which the second intermediate conductive pattern was formed, and forming a third via hole at a position corresponding to the preset position in the second intermediate insulating layer to form an second intermediate insulating pattern layer.

15. The method of fabricating the substrate according to claim 14, Wherein a diameter of the third via hole is larger than a diameter of the second via hole.

16. A display substrate obtained by the fabricating method according to claim 1.

17. The display substrate according to claim 16, wherein the display substrate is an array substrate or an OLED array substrate, the first conductive pattern is a first source and drain layer, and the intermediate conductive pattern is a second source and drain layer.

18. A display apparatus, comprising the substrate of claim 16.

19. A substrate obtained by the fabricating method according to claim 1
   wherein the second conductive pattern is directly connected to the first conductive pattern through a via hole located in the first insulating pattern layer, the intermediate conductive pattern, and the intermediate insulating pattern layer, and is not connected to the intermediate conductive pattern;
   and a distance between a boundary of the intermediate conductive pattern facing the via hole and a boundary of the first conductive pattern opposite to each other is within a critical dimension range.

20. The substrate of claim 19, wherein the critical dimension range is about 0.8 µm.

* * * * *